United States Patent
Wu et al.

(10) Patent No.: US 10,229,650 B2
(45) Date of Patent: Mar. 12, 2019

(54) ARRAY SUBSTRATE AND DISPLAY DEVICE

(71) Applicant: Xiamen Tianma Micro-Electronics Co., Ltd., Xiamen (CN)

(72) Inventors: Xiaoxiao Wu, Xiamen (CN); Guozhao Chen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 9 days.

(21) Appl. No.: 15/786,237

(22) Filed: Oct. 17, 2017

(65) Prior Publication Data

US 2018/0040291 A1 Feb. 8, 2018

(30) Foreign Application Priority Data

Jun. 29, 2017 (CN) .......................... 2017 1 0513018

(51) Int. Cl.
*G09G 5/00* (2006.01)
*G09G 5/18* (2006.01)
*G09G 3/20* (2006.01)

(52) U.S. Cl.
CPC ........... *G09G 5/003* (2013.01); *G09G 3/2092* (2013.01); *G09G 5/18* (2013.01); *G09G 2300/0426* (2013.01); *G09G 2310/0267* (2013.01); *G09G 2310/0283* (2013.01); *G09G 2310/0286* (2013.01); *G09G 2330/04* (2013.01)

(58) Field of Classification Search
CPC ........ G09G 5/003; G09G 3/2092; G09G 5/18; G09G 2300/0426; G09G 2330/04; G09G 2310/0283; G09G 2310/0267; G09G 2310/0286
See application file for complete search history.

(56) References Cited

U.S. PATENT DOCUMENTS

| | | | | |
|---|---|---|---|---|
| 2014/0092082 A1* | 4/2014 | Choi | .................... | G09G 3/3696 345/213 |
| 2016/0334908 A1* | 11/2016 | Zhuang | ................ | G06F 3/0412 |
| 2017/0153752 A1* | 6/2017 | Kurasawa | ............ | G09G 3/3677 |
| 2017/0221423 A1* | 8/2017 | Xiang | .................. | G09G 3/3291 |
| 2018/0190190 A1* | 7/2018 | Xi | ........................ | G09G 3/3225 |
| 2018/0204889 A1* | 7/2018 | Yu | ........................ | G09G 3/3233 |

FOREIGN PATENT DOCUMENTS

CN 104914641 A 9/2015

* cited by examiner

*Primary Examiner* — Amit Chatly
(74) *Attorney, Agent, or Firm* — Alston & Bird LLP

(57) ABSTRACT

An array substrate and a display device are provided. In the array substrate, each of first shift register units and second shift register units is electrically connected to a respective scanning line. Scanning lines electrically connected to the first shift register units at the same stage or to the second shift register units at the same stage are in the same row. Clock signal input terminals of the first shift register units at the same stage or of the second shift register units at the same stage receive the same clock signal. Enable signal input terminals of the first shift register units at the first stage or of the second shift register units at the first stage receive the same enable signal.

13 Claims, 6 Drawing Sheets

ARRAY SUBSTRATE AND DISPLAY DEVICE

CROSS-REFERENCES TO RELATED APPLICATIONS

This application claims priority to Chinese patent application No. CN201710513018.5, filed on Jun. 29, 2017, the disclosure of which is incorporated herein by reference in its entirety.

TECHNICAL FIELD

Embodiments of the present disclosure relate to display technologies, and in particular to an array substrate and a display device.

BACKGROUND

With the continuous development of electronic technology, a display screen as one of the interfaces for interactions between a user and an electronic device is common.

A display panel, a core component of the display screen in the related art, includes a display region and a non-display region surrounding the display region. The display region is typically shaped as a regular rectangle, and is provided with a plurality of parallel scanning lines. In an extending direction of the plurality of scanning lines, non-display regions at two sides of the display region may be both provided with a scan driving circuit including cascaded shift register units. Each shift register unit is electrically connected to a respective scanning line and supplies a scan driving signal to the respective scanning line. However, for a special-shaped display screen, namely, a display screen having one or more notches at an edge extending parallel with the scanning lines, each scanning line is divided into multiple segments by the one or more notches. In this case, if the scan driving circuit is still configured in the original manner, parts of the scanning lines will not be electrically connected to the shift register units. As a result, no scan driving signal is received and the display screen does not display properly.

BRIEF SUMMARY

The present disclosure provides an array substrate and a display device for achieving the normal display of a special-shaped display screen.

According to a first aspect, an embodiment of the present disclosure provides an array substrate. The array substrate includes a display region and a non-display region surrounding the display region. The display region includes a plurality of scanning lines extending in a first direction.

The array substrate includes at least one notch which is arranged at an edge of the array substrate extending in the first direction.

In the first direction, the non-display region at two opposite sides of the display region forms a first non-display region and a second non-display region. The non-display region adjoining to a first side of each notch forms a third non-display region, the non-display region adjoining to a second side of each notch forms a fourth non-display region, and the first side of each notch is closer to the first non-display region than the second side of each notch. The first non-display region and the fourth non-display region are provided with cascaded first shift register units therein. The second non-display region and the third non-display region are provided with cascaded second shift register units therein. Each of the first shift register units and the second shift register units is electrically connected to a respective one of the plurality of scanning lines. The scanning lines electrically connected to the first shift register units at the same stage are in the same row, and the scanning lines electrically connected to the second shift register units at the same stage are in the same row.

The same clock signal is input into clock signal input terminals of the first shift register units at the same stage, and the same clock signal is input into clock signal input terminals of the second shift register units at the same stage. The same enable signal is input into enable signal input terminals of the first shift register units at the same stage, and the same enable signal is input into enable signal input terminals of the second shift register units at the same stage.

According to a second aspect, an embodiment of the present further provides a display device. The display device includes the array substrate described in the first aspect.

The array substrate provided by embodiments of the present disclosure includes the display region and the non-display region surrounding the display region. The display region includes the plurality of scanning lines extending in the first direction. The array substrate includes at least one notch which is arranged at the edge of the array substrate extending in the first direction. In the first direction, the non-display region at two opposite sides of the display region forms the first non-display region and the second non-display region. The non-display region adjoining to a first side of each notch forms a third non-display region, the non-display region adjoining to a second side of each notch forms a fourth non-display region, and the first side of each notch is closer to the first non-display region than the second side of each notch. The first non-display region and the fourth non-display region are provided with cascaded first shift register units therein. The second non-display region and the third non-display region are provided with cascaded second shift register units therein. Each of the first shift register units and the second shift register units is electrically connected to a respective one of the plurality of scanning lines. The scanning lines electrically connected to the first shift register units at the same stage are in the same row, and the scanning lines electrically connected to the second shift register units at the same stage are in the same row. The same clock signal is input into clock signal input terminals of the first shift register units at the same stage, and the same clock signal is input into clock signal input terminals of the second shift register units at the same stage. The same enable signal is input into enable signal input terminals of the first shift register units at the same stage, and the same enable signal is input into enable signal input terminals of the second shift register units at the same stage.

BRIEF DESCRIPTION OF DRAWINGS

Other features, objects and advantages of the present disclosure will become more apparent from a detailed description of non-limiting embodiments with reference to the following drawings.

DETAILED DESCRIPTION

Figure 1:
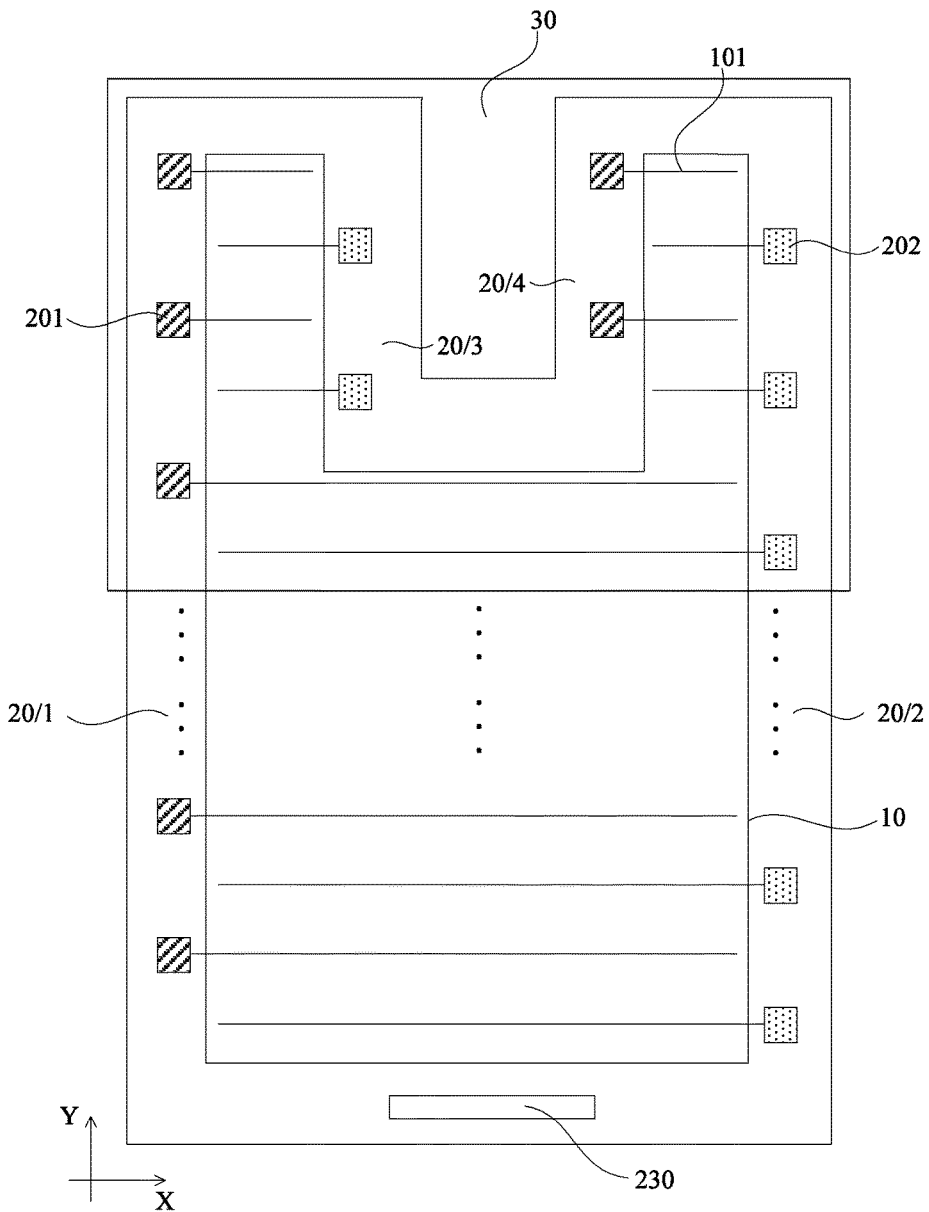
FIG. 1 is a schematic structural diagram of an array substrate according to an embodiment of the present disclosure.

In order to further describe the technical solutions and the effects of the present disclosure for achieving the intended purpose, specific embodiments, structures, features and effects of a display panel and a manufacturing method thereof provided according to the present disclosure are described below with reference to the accompanying drawings and preferred embodiments.

An embodiment of the present disclosure provides an array substrate. The array substrate includes a display region and a non-display region surrounding the display region. The display region includes a plurality of scanning lines extending in a first direction.

The array substrate includes at least one notch which is arranged at an edge of the array substrate extending in the first direction.

In the first direction, the non-display region at two opposite sides of the display region forms a first non-display region and a second non-display region. The non-display region adjoining to a first side of each notch forms a third non-display region, the non-display region adjoining to a second side of each notch forms a fourth non-display region, and the first side of each notch is closer to the first non-display region than the second side of each notch to the first non-display region. The first non-display region and the fourth non-display region are provided with cascaded first shift register units therein. The second non-display region and the third non-display region are provided with cascaded second shift register units therein. Each of the first shift register units and the second shift register units is electrically connected to a respective one of the plurality of scanning lines. The scanning lines electrically connected to the first shift register units at the same stage are in the same row, and the scanning lines electrically connected to the second shift register units at the same stage are in the same row.

The same clock signal is input into clock signal input terminals of the first shift register units at the same stage, and the same clock signal is input into clock signal input terminals of the second shift register units at the same stage. The same enable signal is input into enable signal input terminals of the first shift register units at the same stage, and the same enable signal is input into enable signal input terminals of the second shift register units at the same stage.

The array substrate provided by embodiments of the present disclosure includes the display region and the non-display region surrounding the display region. The display region includes the plurality of scanning lines extending in the first direction. The array substrate includes at least one notch which is arranged at the edge of the array substrate extending in the first direction. In the first direction, the non-display region at two opposite sides of the display region forms the first non-display region and the second non-display region. The non-display region adjoining to a first side of each notch forms a third non-display region, the non-display region adjoining to a second side of each notch forms a fourth non-display region, and the first side of each notch is closer to the first non-display region than the second side of each notch. The first non-display region and the fourth non-display region are provided with cascaded first shift register units therein. The second non-display region and the third non-display region are provided with cascaded second shift register units therein. Each of the first shift register units and the second shift register units is electrically connected to a respective one of the plurality of scanning lines. The scanning lines electrically connected to the first shift register units at the same stage are in the same row, and the scanning lines electrically connected to the second shift register units at the same stage are in the same row. The same clock signal is input into clock signal input terminals of the first shift register units at the same stage, and the same clock signal is input into clock signal input terminals of the second shift register units at the same stage. The same enable signal is input into enable signal input terminals of the first shift register units at the same stage, and the same enable signal is input into enable signal input terminals of the second shift register units at the same stage. Such configuration enables each of the scanning lines to receive the corresponding scan driving signal, thereby achieving the normal display of a special-shaped display screen.

The foregoing is the concept of the present disclosure. The technical solutions in embodiments of the present disclosure will be clearly and fully described in conjunction with the accompanying drawings in the embodiments of the present disclosure. It is apparent that some but not all of embodiments of the present disclosure are described herein. According to embodiments of the present disclosure, all other embodiments obtained by those of ordinary skill in the art without creative work are within the scope of the present disclosure.

Numerous details are set forth in the following description to facilitate a thorough understanding of the disclosure, but the present disclosure may be carried out by other embodiments which are different form the embodiments described herein. Those skilled in the art will be able to make similar generalizations without departing from the spirit of the disclosure. The present disclosure is not limited to the specific embodiments disclosed below.

Secondly, the present disclosure is described in detail with reference to the accompanying drawings. When describing embodiments of the present disclosure in detail, for ease of explanation, the schematic diagrams showing structures of apparatuses and devices are not partially enlarged in accordance with the general proportions, and these schematic diagrams are merely illustrative and should not be construed as limiting the scope of the disclosure. Furthermore, in the actual production, three-dimensional sizes: length, width and height are to be included.

FIG. 1 is a schematic structural diagram of an array substrate according to an embodiment of the present disclosure. As show in FIG. 1, the array substrate includes a display region 10 and a non-display region 20 surrounding the display region 10. The display region 10 includes a plurality of scanning lines 101 extending in a first direction X. The array substrate includes at least one notch 30. The notch 30 is disposed at an edge of the array substrate extending in the first direction X. Along the first direction, non-display regions 20 at two opposite sides of the display region 10 are a first non-display region 20/1 and a second non-display region 20/2. The non-display region 20 at a side of each notch 30 closer to the first non-display region 20/1 is a third non-display region 20/3. The non-display region 20 at a side of each notch 30 closer to the second non-display region 20/2 is a fourth non-display region 20/4. Cascaded first shift register units 201 are disposed in the first non-display region 20/1 and the fourth non-display region 20/4. Cascaded second shift register units 202 are disposed in the second non-display region 20/2 and the third non-display region 20/3. Each of the first shift register units 201 and the second shift register units 202 is electrically connected to a respective scanning line 101. The scanning lines 101 electrically connected to the first shift register units 201 that are at the same stage are in the same row, and the scanning lines 101 electrically connected to the second shift register units 202 that are at the same stage are in the same row.

Figure 2:
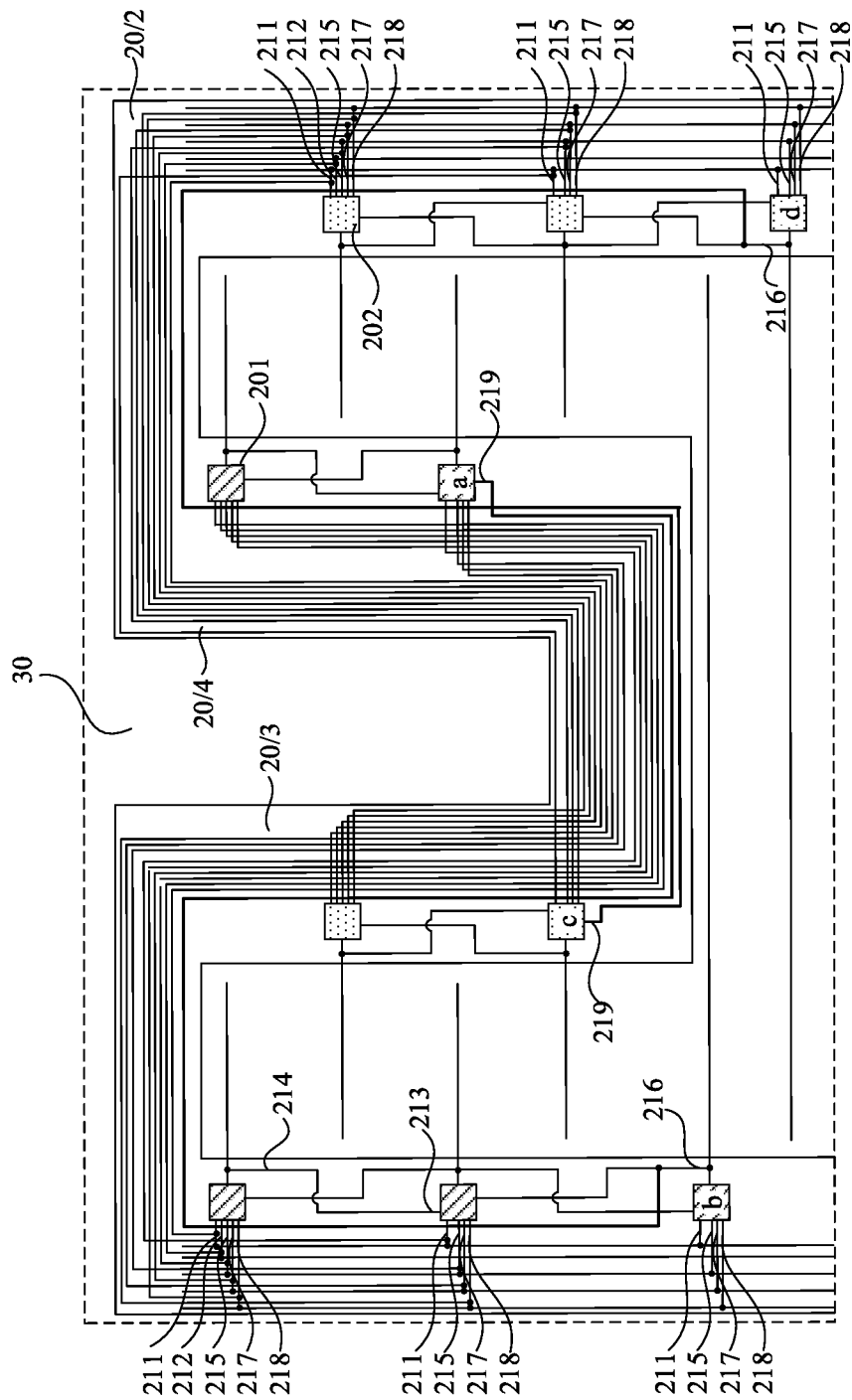
FIG. 2 is an enlarged partial diagram corresponding to a rectangle dashed box in FIG. 1.

FIG. 2 is an enlarged partial diagram corresponding to a rectangle dashed box in FIG. 1. As shown in FIG. 2, each of the first shift register units 201 and the second shift register units 202 includes a clock signal input terminal 211. Each of the first shift register units 201 at the first stage and the second shift register units 202 at the first stage further includes an enable signal input terminal. A same clock signal is input into the clock signal input terminals 211 of the first shift register unit 210 at the same stage, and a same clock signal is input into the second shift register unit 220 at the same stage. A same enable signal is input into the enable signal input terminals 212 of the first shift register units 201 at the first stage, and a same enable signal is input into the enable signal input terminals 212 of the second shift register units 202 at the first stage.

It should be noted that the clock signal input terminals 211 receive the clock signal for synchronizing the operation between the first shift registers 201 and other components in the display screen or between the second shift registers 202 and other components in the display screen. The enable signal input terminals 212 receive the enable signal for triggering the cascaded first shift register units 201 or the cascaded second shift register units 202 to start operation. It should be noted that when the cascaded shift register units are operating normally, an trigger signal output terminal 214 of the shift register unit at a respective stage can sequentially output a forward trigger signal to a forward initiating signal input terminal 213 of the shift register unit at a lower stage, so that the shift register units at the respective stages start to operate sequentially, and then corresponding scanning lines are sequentially scanned sequentially. The enable signal input terminal 212 of each shift register unit also serves as its forward initiating signal input terminal 213; nevertheless, the enable signal input terminal 212 receives an initiating signal from a control chip 230 rather than the forward trigger signal outputted by the shift register unit at an upper stage.

It should also be noted that, for the cascaded shift register units, the cascaded shift register units can operate well when the shift register unit at the first stage receives the enable signal and the shift register units at the respective stages can receive the corresponding clock signals. In the present embodiment, the clock signal input terminals 211 of the first shift register units 201 at the same stage are configured to receive the same clock signal, and the clock signal input terminals 211 of the second shift register units 202 at the same stage are configured to receive the same clock signal. The enable signal input terminals 212 of the first shift register units 201 at the first stage are configured to receive the same enable signal, and the enable signal input terminals 212 of the second shift register units 202 at the first stage are configured to receive the same enable signal. Through such configurations, on the one hand, the cascaded first shift register units 201 in the first non-display region 20/1 and the fourth non-display region 20/4can operate normally and the cascaded second shift register units 202 in the second non-display region 20/2 and the third non-display region 20/3 can operate normally; on the other hand, it is ensured that the cascaded first shift register units 201 in the first non-display region 20/1 and the fourth non-display region 20/4 have the same timing sequence and the cascaded second shift register units 202 in the second non-display region 20/2 and the third non-display region 20/3 have the same timing sequence, thereby achieving the normal display of the display screen.

It is also to be noted that, FIG. 1 only illustrates an example in which the array substrate includes one notch 30, and is not a limitation to the number and positions of the notches 30. It should be understood that, in other implementations of the present embodiment, the number of the notches 30 included in the array substrate may be two or more than two, and positions of the notches 30 can be reasonably designed by operating personnel, on the premise that at least one notch 30 is disposed at an edge of the array substrate extending in the first direction.

The array substrate provided by the present embodiment includes the display region 10 and the non-display region 20 surrounding the display region 10. The display region 10 includes the plurality of scanning lines 101 extending in the first direction X. The array substrate includes at least one notch 30 which is arranged on the edge of the array substrate extending in the first direction X. In the first direction, non-display regions 20 at two opposite sides of the display region 10 are the first non-display region 20/1 and the second non-display region 20/2. The non-display region 20 at the side of each notch 30 closer to the first non-display region 20/1 is the third non-display region 20/3. The non-display region 20 at the side of each notch 30 closer to the second non-display region 20/2 is the fourth non-display region 20/4. Cascaded first shift register units 201 are disposed in the first non-display region 20/1 and the fourth non-display region 20/4. Cascaded second shift register units 202 are disposed in the second non-display region 20/2 and the third non-display region 20/3. Each of the first shift register units 201 and the second shift register units 202 is electrically connected to a respective scanning line 101. The scanning lines 101 electrically connected to the first shift register units 201 that are at the same stage are in the same row, and the scanning lines 101 electrically connected to the second shift register units 202 that are at the same stage are in the same row. The same clock signal is input into the clock signal input terminals 211 of the first shift register units 210 at the same stage or the second shift register units 220 at the same stage. The same enable signal is input into the enable signal input terminals 212 of the first shift register units 201 at the first stage or the second shift register units 202 at the first stage. Such configuration enables each of the scanning lines 101 to receive the corresponding scan driving signal, thereby achieving the normal display of the special-shaped display screen.

As shown in FIG. 1, in a second direction Y, which is perpendicular to the first direction X, the scanning lines 101 electrically connected to the first shift register units 201 and the scanning lines 101 electrically connected to the second shift register units 202 may be alternately arranged. Such configuration is similar to the configuration of the cascaded shift register units of the traditional scan driving circuit, so the compatibility with the related art is better and the design process is simpler than other manners.

In one embodiment, as shown in FIG. 2, a same anti-abnormal-power-off signal may be input into anti-abnormal-power-off signal input terminals 215 of the first shift register units 201 that are electrically connected to scanning lines in the same row or the second shift register units 202 that are electrically connected to scanning lines 101 in the same row.

Such configuration increases the connection relation of the anti-abnormal-power-off signal input terminals 215, and ensures that the timing sequences of the cascaded first shift register units 201 in the first non-display region 20/1 and the fourth non-display region 20/4 are still the same and the timing sequences of the cascaded second shift register units 202 in the second non-display region 20/2 and the third non-display region 20/3 are still the same. It should be noted that, the anti-abnormal-power-off signal input terminal 215 receives the anti-abnormal-power-off signal, and the anti-abnormal-power-off signal can remove the charges on the scanning line 101 after the display screen is abnormally powered off to prevent a remaining charge on the scan line 101.

With continued reference to FIG. 1 and FIG. 2, a reverse initiating signal input terminal 219 of the first shift register unit a at the nth stage as the last stage in the fourth non-display region 20/4 is connected to a secondary signal trigger terminal 216 of the first shift register unit b at the (n+1)th stage in the first non-display region 20/1; and the reverse initiating signal input terminal 219 of the second shift register unit c at the nth stage as the last stage in the third non-display region 20/3 is connected to the secondary signal trigger terminal 216 of the second shift register unit d at the (n+1)th stage in the second non-display region 20/2. The same forward scanning signal is input into the forward scanning signal input terminals 217 of the first shift register units 201 which are electrically connected to the scanning lines 101 in the same row, or the second shift register units 202 which are electrically connected to the scanning lines 101 in the same row.

It should be noted that such configuration enables a reverse triggering signal outputted by the secondary signal trigger terminal 216 of the first shift register unit B to be transmitted to the reverse initiating signal input terminal 219 of the first shift register unit A, and the reverse triggering signal outputted by the secondary signal trigger terminal 216 of the second shift register unit D to be transmitted to the reverse initiating signal input terminal 219 of the second shift register unit C, thereby achieving the reverse scanning of each scanning line 101.

It is further to be noted that when the forward scanning signal outputted by the control chip 230 is input into the forward scanning signal input terminal 217 of each first shift register unit 201 and the forward scanning signal input terminal 217 of each second shift register 202, the cascaded first shift register units 201 and the cascaded second shift register units 202 output scanning signals to corresponding scanning lines sequentially from top to bottom, so the forward scanning of the display screen is achieved. When the reverse scanning signal outputted by the control chip 230 is input into the reverse scanning signal input terminal 218 of each first shift register unit 201 and the reverse scanning signal input terminal 218 of each second shift register unit 202, the cascaded first shift register units 201 and the cascaded second shift register units 202 output scanning signals to corresponding scanning lines sequentially from bottom to top, so the reverse scanning of the display screen is achieved.

Figure 3:
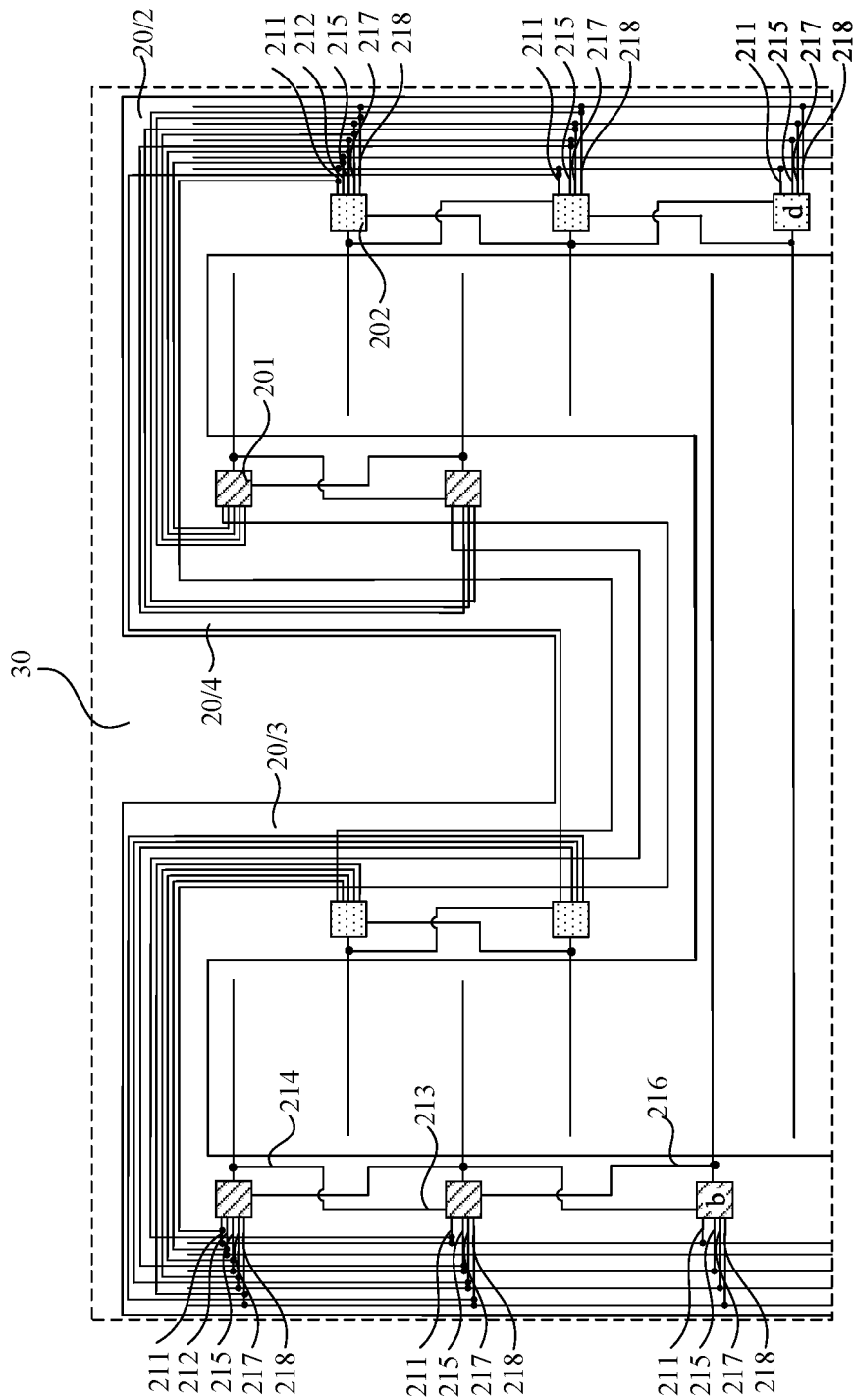
FIG. 3 is another enlarged partial diagram corresponding to a rectangle dashed box in FIG. 1.

FIG. 3 is an enlarged partial diagram corresponding to a rectangle dashed box in FIG. 1. As shown in FIG. 3, the array substrate includes one notch 30, a general signal input terminal of the first shift register unit 201 at a respective stage in the first non-display region 20/1 is connected to a corresponding general signal input terminal of the second shift register unit 202 in the third non-display region 20/3 which is at the same stage as the first shift register unit 201 at the respective stage in the first non-display region 20/1; and a general signal input terminal of the second shift register unit 202 at the respective stage in the second non-display region 20/2 is connected to a corresponding general signal input terminal of the first shift register unit 201 in the fourth non-display region 20/4 which is at the same stage as the second shift register unit 202 at the respective stage in the second non-display region 20/2. The general signal input terminal includes the enable signal input terminal 212, the forward scanning signal input terminal 217, the reverse scanning signal input terminal 218 and the anti-abnormal-power-off signal input terminal 215.

It should be noted that the general signal input terminal refers to a signal input terminal receiving the same signal from the first shift register unit and the second shift register unit. In order to reduce the length of connecting lines, in one embodiment, a configuration in which a connecting line is connected to the closest connecting line may be employed. The general signal input terminal of the first shift register unit 201 at the respective stage in the first non-display region 20/1 is connected to the corresponding general signal input terminal of the second shift register unit 202 in the third non-display region 20/3 which is at the same stage as the first shift register unit 201 at the respective stage in the first non-display region 20/1; and the general signal input terminal of the second shift register unit 202 at the respective stage in the second non-display region 20/2 is connected to the corresponding general signal input terminal of the first shift register unit 201 in the fourth non-display region 20/4 which is at the same stage as the second shift register unit 202 at the respective stage in the second non-display region 20/2. In addition, such connecting configuration can effectively reduce the quantity of the connecting wires between the third non-display region 20/3 and the fourth non-display region 20/4, and facilitates the realization of the narrow bezel of the display screen.

In one embodiment, the shape of the notch 30 may include a trapezoid, a rectangle, a triangle and the like. The present embodiment is not particularly limited to any one shape, and the operating personnel can reasonably design the shape according to actual needs.

Figure 4:
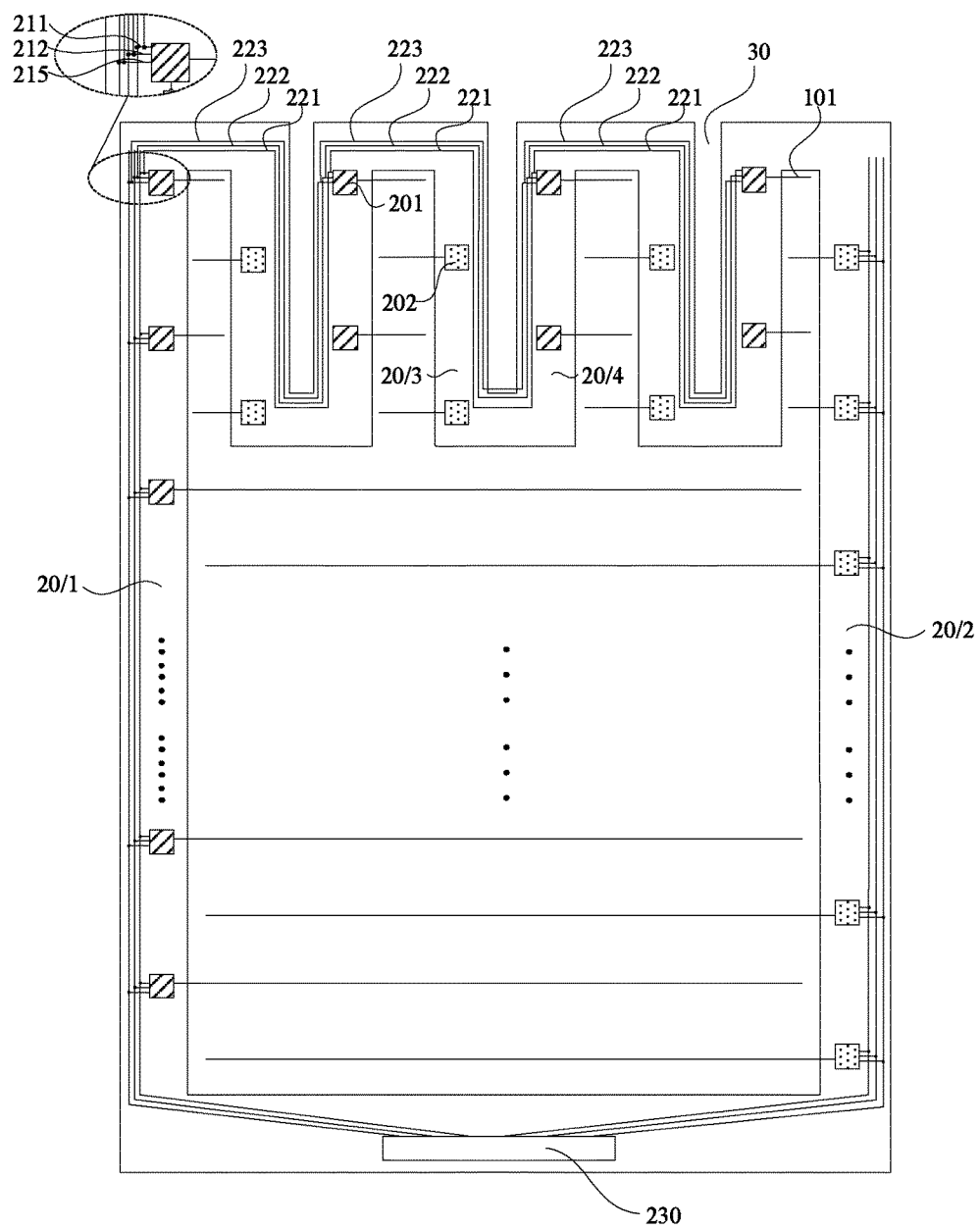
FIG. 4 is a schematic structural diagram of another array substrate according to an embodiment of the present disclosure.

FIG. 4 is a schematic structural diagram of another array substrate according to an embodiment of the present disclosure. The array substrate shown in FIG. 4 is similar to the array substrate shown in FIG. 1. The difference is that the quantity of the notches 30 which are arranged at the edge extending in the first direction X of the array substrate in FIG. 4 is more than one.

It should be noted that to simplify the wiring configuration of the array substrate so as to more clearly illustrate the technical solution, FIG. 4 illustrates a connecting configuration of the signal input terminals of the first shift register units 201 at the first stage. The connecting configurations of signal input terminals of the first shift register units 201 at other stages are the same as the connecting configuration of signal input terminals of the first shift register units 201 at the first stage except the enable signals specific to the first shift register units 201 at the first stage. The connecting configuration of the signal input terminals of the second shift register units 202 at the respective stage is the same as the connecting configuration of the signal input terminals of the first shift register units 201 at the same stage as the second shift register units 202 at the respective stage.

As shown in FIG. 4, clock signal input terminals 211 of the first shift register units 201 electrically connected to the scanning lines 101 in the same row are sequentially connected by a first connecting line 221 correspondingly arranged in the non-display region 20. The enable signal input terminals 212 of the first shift register units 201 at the first stage are sequentially connected by a second connecting line 222 correspondingly arranged in the non-display region 20. The anti-abnormal-power-off signal input terminals 215 of the first shift register units 201 electrically connected to the scanning lines 101 in the same row are sequentially connected by a third connecting line 223 correspondingly arranged in the non-display region 20.

In addition, the clock signal input terminals of the second shift register units 202 electrically connected to the scanning lines 101 in the same row are sequentially connected by another first connecting line correspondingly arranged in the non-display region 20 in the same manner as that of the first shift register units. Enable signal input terminals of the second shift register units 202 at the first stage are sequentially connected by another second connecting line correspondingly arranged in the non-display region 20. The anti-abnormal-power-off signal input terminals of the second shift register units 202 electrically connected to the scanning lines 101 in the same row are sequentially connected by another third connecting line 223 correspondingly arranged in the non-display region 20 (not shown in FIG. 4).

It should be noted that, as shown in FIG. 4, signal output terminals of the control chip 230 are electrically connected to corresponding signal input terminals of the first shift register units 201 at the respective stages in the first non-display region 20/1 and corresponding signal input terminals of the second shift register units 202 at the respective stages in the second non-display region 20/2. Such configuration is better compatible with the related art.

It should be further noted that, in the connecting configuration shown in FIG. 4, each first shift register unit 201 only needs to be provided with a connecting line between the first shift register unit 201 and the adjacent first shift register unit 201 at the same stage. Likewise, each second shift register unit 202 only needs to be provided with a connecting line between the second shift register unit 202 and the adjacent second shift register unit 202 of the same stag (not shown in FIG. 4). In contrast to other configurations of the connecting lines, such configuration minimizes the number of connecting lines among adjacent first shift register units at the same stage and connecting lines among adjacent second shift register units at the same stage, and thus facilitates the narrow bezel of the display panel.

Figure 5:
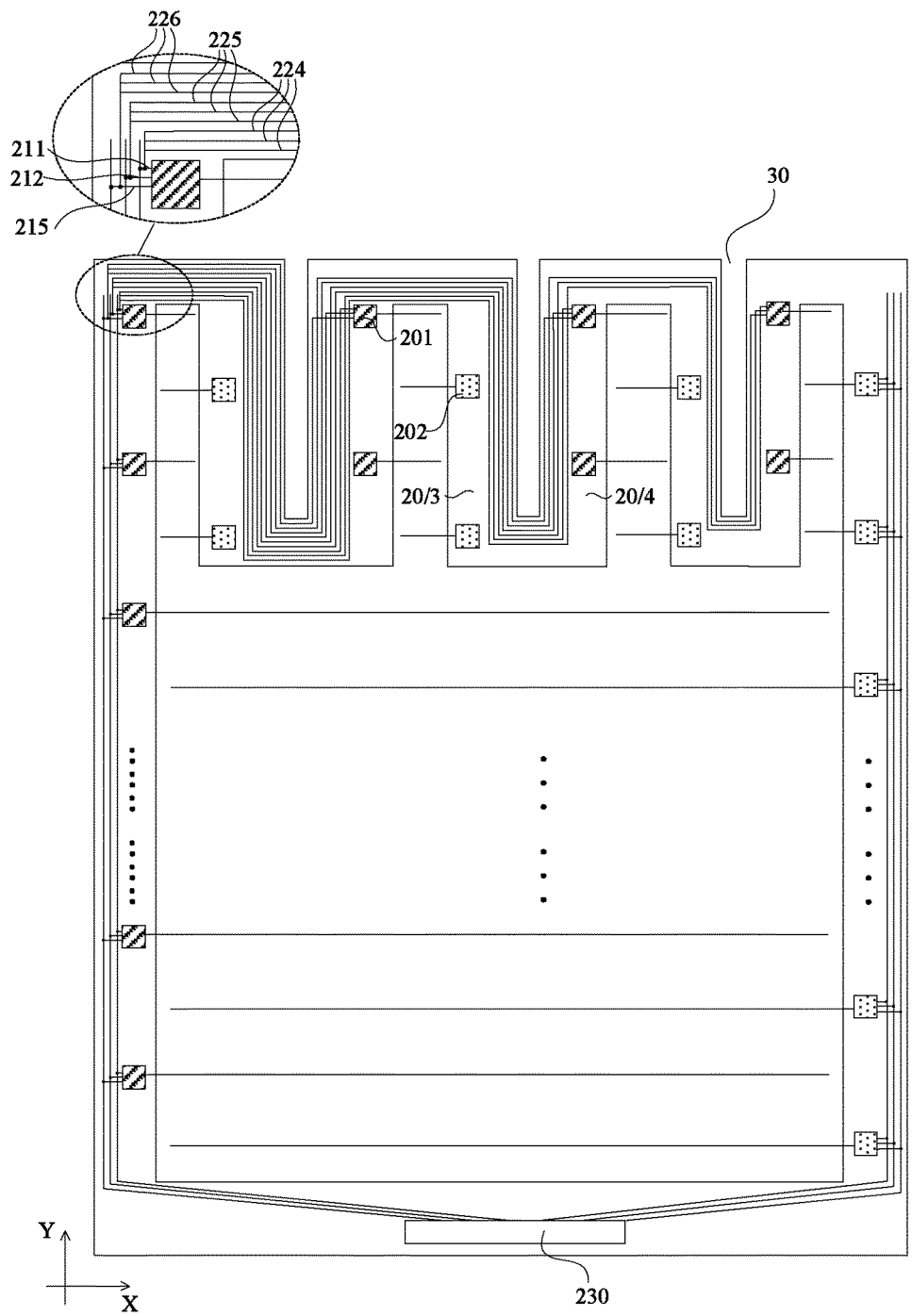
FIG. 5 is a schematic structural diagram of yet another array substrate according to an embodiment of the present disclosure.

FIG. 5 is a schematic structural diagram of yet another array substrate according to an embodiment of the present disclosure. The array substrate shown in FIG. 5 is similar to structure of FIG. 4 except that in FIG. 5, the clock signal input terminal 211 of each first shift register unit 201 in the fourth non-display areas 20/4 is connected to the clock signal input terminal 211 of the first shift register unit 201 at the same stage in the first non-display region 20/1 via a respective fourth connecting line 224 correspondingly arranged in the non-display region 20. The enable signal input terminal 212 of each first shift register unit 201 at the first stage in the fourth non-display region 20/4 is connected to the enable signal input terminal 212 of the first shift register unit 201 at the first stage in the first non-display region 20/1 via a respective sixth connecting line 225 correspondingly arranged in the non-display region 20. The anti-abnormal-power-off signal input terminal 215 of each first shift register unit 201 in the fourth non-display region 20/4 is connected to the anti-abnormal-power-off signal input terminal 215 of the first shift register unit 201 at the same stage in the first non-display region 20/1 via a respective eighth connecting line 226 correspondingly arranged in the non-display region 20.

It should be noted that to simplify the wiring configuration of the array substrate so as to more clearly illustrate the technical solution, FIG. 5 illustrates a connecting configuration of the signal input terminal of the first shift register units 201 at the first stage. Similar to FIG. 4, the connecting configurations of signal input terminals of the first shift register units 201 at other stages are the same as the connecting configuration of signal input terminals of the first shift register units 201 at the first stage except for the enable signals specific to the first shift register units 201 at the first stage. The connecting configuration of the signal input terminals of the second shift register units 202 at the respective stage is the same as the connecting configuration of the signal input terminals of the first shift register units 201 at the same stage as the second shift register units 202 at the respective stage.

It can be seen that the clock signal input terminal 211 of each second shift register unit 202 in the third non-display region 20/3 is connected to the clock signal input terminal 211 of second shift register unit 202 at the same stage in the second non-display region 20/2 via a respective fifth connecting line correspondingly arranged in the non-display region 20. The enable signal input terminal 212 of each second shift register units 202 at the first stage in the third non-display region 20/3 is connected to the enable signal input terminal 212 of the second shift register unit 202 at the first stage in the second non-display region 20/2 via a respective seventh connecting line correspondingly arranged in the non-display region 20. The anti-abnormal-power-off signal input terminal 215 of each second shift register unit 202 in the third non-display region 20/3 is connected to the anti-abnormal-power-off signal input terminal 215 of the second shift register unit 202 at the same stage in the second non-display region 20/2 via a respective ninth connecting line correspondingly arranged in the non-display region 20 (not shown in FIG. 5).

It should be further noted that, in the connecting configuration in FIG. 5, the multiple signal input terminals of each first shift register unit 201 in the fourth non-display region 20/4 are all electrically connected to corresponding signal input terminals of the first shift register unit 201 at the same stage in the first non-display region 20/1 directly via connecting lines. In addition, the multiple signal input terminals of each second shift register unit 202 in the third non-display region 20/3 are all electrically connected to corresponding signal input terminals of the second shift register unit 202 at the same stage in the second non-display region 20/2 directly via connecting lines (not shown in FIG. 5). Such a configuration can improve the fidelity of the signal due to the single-line transmission of the signal.

With continued reference to FIG. 5, the array substrate further includes a control chip 230. The control chip 230 may be disposed in the non-display region 20 at a side of the display region 10 in the second direction Y that is perpendicular to the first direction X. Further, as shown in FIG. 3, the at least one notch 30 may be arranged at a side of the display region 10 farther from the control chip 230. Since the side of the non-display region 20 where the control chip 230 is located includes multiple connecting lines for connecting the control chip 230 and wires in the display region 10 and functional wires such as ground wires, the at least one notch 30 is arranged at the side opposite to the control chip 230 in an embodiment so to prevent the above-mentioned connecting lines and functional wires from being tortuous and easy to break.

It should be noted that the connecting configuration of the signal terminals of first shift register units 201 at the same stage or the second shift register units 202 at the same stage is illustrated in FIG. 4 and FIG. 5 by taking the clock signal input terminals 211, the enable signal input terminals 212 and the anti-abnormal-power-off signal input terminals 215 as examples. It should be understood that for a display screen that is capable of achieving forward scanning and reverse scanning of the scanning lines simultaneously, the connecting configurations of the forward scanning signal input terminals and the reverse scanning signal input terminals may be arranged with reference to the terminal connecting configurations as shown in FIG. 4 and FIG. 5.

Figure 6:
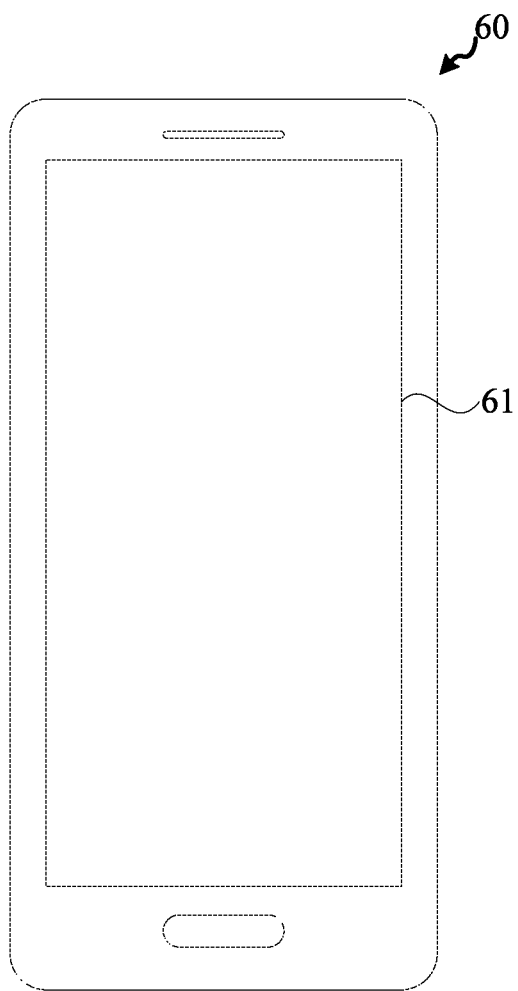
FIG. 6 is a schematic structural diagram of a display device according to an embodiment of the present disclosure.

FIG. 6 is a schematic structural diagram of a display device according to an embodiment of the present disclosure. As shown in FIG. 6, a display device 60 includes an array substrate 61 of any embodiment of the present disclosure. The display device further includes a counter substrate which is opposite to the array substrate 61. It should be noted that if the display device 60 is a liquid crystal display device, the counter substrate is a color filter substrate. If the display device 60 is an organic light-emitting display device, the counter substrate is a cover plate.

It is to be noted that the above are only preferred embodiments of the present disclosure and the technical principles employed. It will be understood by those skilled in the art that the present disclosure is not limited to the specific embodiments described herein and that various modifications, adaptations, combinations and substitutions can be made by those skilled in the art without departing from the scope of the present disclosure. Thus, while the present disclosure has been described in detail by way of the above embodiments, the present disclosure is not limited to the above embodiments, but may include other equivalent embodiments without departing from the inventive concept, and the scope of present disclosure is determined by the appended claims.

What is claimed is:

1. An array substrate, comprising:
   a display region and a non-display region surrounding the display region, wherein the display region comprises a plurality of scanning lines extending in a first direction;
   the array substrate further comprises: at least one notch, which is arranged at an edge extending in the first direction of the array substrate;
   in the first direction, the non-display region at two opposite sides of the display region respectively forms a first non-display region and a second non-display region, the non-display region adjoining to a first side of each notch forms a third non-display region, the non-display region adjoining to a second side of each notch forms a fourth non-display region, and the first side of each notch is closer to the first non-display region than the second side of each notch, the first non-display region and the fourth non-display region are provided with cascaded first shift register units therein, the second non-display region and the third non-display region are provided with cascaded second shift register units therein, and each of the first shift register units and the second shift register units is electrically connected to a respective one of the plurality of scanning lines;
   among the plurality of scanning lines, scanning lines electrically connected to the first shift register units at a same stage are in a same row, and scanning lines electrically connected to the second shift register units at a same stage are in a same row;
   a same clock signal is input into clock signal input terminals of the first shift register units at a same stage, and a same clock signal is input into clock signal input terminals of the second shift register units at a same stage; and
   a same enable signal is input into enable signal input terminals of the first shift register units at a first stage, and a same enable signal is input into enable signal input terminals of the second shift register units at a first stage.

2. The array substrate of claim 1, wherein in a second direction perpendicular to the first direction, scanning lines electrically connected to the first shift register units and scanning lines electrically connected to the second shift register units are alternately arranged.

3. The array substrate of claim 1, wherein a same anti-abnormal-power-off signal is input into anti-abnormal-power-off signal input terminals of the first shift register units which are electrically connected to scanning lines in the same row; and a same anti-abnormal-power-off signal is input into anti-abnormal-power-off signal input terminals of the second shift register units which are electrically connected to scanning lines in the same row.

4. The array substrate of claim 3, wherein clock signal input terminals of the first shift register units which are electrically connected to scanning lines in the same row are connected by a first connecting line correspondingly arranged in the non-display region, and clock signal input terminals of the second shift register units which are electrically connected to scanning lines in the same row are connected by another first connecting line correspondingly arranged in the non-display region;
   enable signal input terminals of the first shift register units at the first stage are connected by a second connecting line correspondingly arranged in the non-display region, and enable signal input terminals of the second shift register units at the first stage are connected by another second connecting line correspondingly arranged in the non-display region; and
   anti-abnormal-power-off signal input terminals of the first shift register units which are electrically connected to scanning lines in the same row are connected by a third connecting line correspondingly arranged in the non-display region, and anti-abnormal-power-off signal input terminals of the second shift register units which are electrically connected to scanning lines in the same row are connected by another third connecting line correspondingly arranged in the non-display region.

5. The array substrate of claim 3, wherein a clock signal input terminal of each first shift register unit in the fourth non-display region is connected to a clock signal input terminal of a first shift register unit at the same stage in the first non-display region by a respective fourth connecting line correspondingly arranged in the non-display region, and a clock signal input terminal of each second shift register unit in the third non-display region is connected to a clock signal input terminal of a second shift register unit at the same stage in the second non-display region by a respective fifth connecting line correspondingly arranged in the non-display region.

6. The array substrate of claim 3, wherein an enable signal input terminal of each first shift register unit at the first stage in the fourth non-display region is connected to an enable signal input terminal of a first shift register unit at the first stage in the first non-display region by a respective sixth connecting line correspondingly arranged in the non-display region, and an enable signal input terminal of each second shift register unit at the first stage in the third non-display region is connected to an enable signal input terminal of a second shift register unit at the first stage in the second non-display region by a respective seventh connecting line correspondingly arranged in the non-display region.

7. The array substrate of claim 3, wherein an anti-abnormal-power-off signal input terminal of each first shift register unit in the fourth non-display region is connected to an anti-abnormal-power-off signal input terminal of a first shift register unit at the same stage in the first non-display region by a respective eighth connecting line correspondingly arranged in the non-display region, and an anti-abnormal-power-off signal input terminal of each second shift register unit in the third non-display region is connected to an anti-abnormal-power-off signal input terminal of a second shift register unit at the same stage in the second non-display region by a respective ninth connecting line correspondingly arranged in the non-display region.

8. The array substrate of claim 1, further comprising a control chip, which is disposed in the non-display region at a side of the display region in a second direction perpendicular to the first direction.

9. The array substrate of claim 8, wherein the at least one notch is arranged at a side of the display region farther from the control chip.

10. The array substrate of claim 9, wherein a reverse initiating signal input terminal of a first shift register unit at an nth stage as a final stage in the fourth non-display region is connected to a secondary signal trigger terminal of a first shift register unit at an (n+1)th stage in the first non-display region;
   a reverse initiating signal input terminal of the second shift register unit at the nth stage as the final stage in the third non-display region is connected to a secondary signal trigger terminal of a second shift register unit at the (n+1)th stage in the second non-display region; and
   a same forward scanning signal is input into forward scanning signal input terminals of first shift register units which are electrically connected to scanning lines in the same row, and a same reverse scanning signal is input into reverse scanning signal input terminals of first shift register units which are electrically connected to scanning lines in the same row; and a same forward scanning signal is input into forward scanning signal input terminals of second shift register units which are electrically connected to scanning lines in the same row, and a same reverse scanning signal is input into reverse scanning signal input terminals of second shift register units which are electrically connected to scanning lines in the same row.

11. The array substrate of claim 10, wherein the array substrate comprises one notch, a general signal input terminal of a first shift register unit at a respective stage in the first non-display region is connected to a corresponding general signal input terminal of a second register unit in the third non-display region which is at the same stage as the first shift register unit at the respective stage in the first non-display region; and a general signal input terminal of a second shift register unit at the respective stage in the second non-display region is connected to a corresponding general signal input terminal of a first register unit in the fourth non-display region which is at the same stage as the second shift register unit at the respective stage in the second non-display region; and wherein
   the general signal input terminal includes an enable signal input terminal, a forward scanning signal input terminal, a reverse scanning signal input terminal and an anti-abnormal-power-off signal input terminal.

12. The array substrate of claim 1, wherein a shape of the at least one notch comprises one or more of a trapezoid, a rectangle and a triangle.

13. A display device comprising an array substrate, wherein the array substrate comprises: a display region and a non-display region surrounding the display region;
   the display region comprises a plurality of scanning lines extending in a first direction;
   the array substrate further comprises at least one notch, which is arranged at an edge extending in the first direction of the array substrate;
   in the first direction, the non-display region at two opposite sides of the display region respectively forms a first non-display region and a second non-display region, the non-display region adjoining to a first side of each notch forms a third non-display region, the non-display region adjoining to a second side of each notch forms a fourth non-display region, and the first side of each notch is closer to the first non-display region than the second side of each notch, the first non-display region and the fourth non-display region are provided with cascaded first shift register units therein, the second non-display region and the third non-display region are provided with cascaded second shift register units therein, and each of the first shift register units and the second shift register units is electrically connected to a respective one of the plurality of scanning lines;
   among the plurality of scanning lines, scanning lines electrically connected to the first shift register units at the same stage are in a same row, and scanning lines electrically connected to the second shift register units at the same stage are in the same row;
   a same clock signal is input into clock signal input terminals of the first shift register units at the same stage, and a same clock signal is input into clock signal input terminals of the second shift register units at the same stage; and
   a same enable signal is input into an enable signal input terminal of each of the first shift register units at a first stage, and a same enable signal is input into an enable signal input terminal of each of the second shift register units at the first stage.

* * * * *